United States Patent
Feigelson et al.

(10) Patent No.: US 8,999,060 B2
(45) Date of Patent: *Apr. 7, 2015

(54) METHOD OF GROWING GAN WHISKERS FROM A GALLIUM-CONTAINING SOLVENT AT LOW PRESSURE AND LOW TEMPERATURE

(71) Applicants: Boris N. Feigelson, Springfield, VA (US); Jennifer K. Hite, Arlington, VA (US); Francis J. Kub, Arnold, MD (US); Charles R. Eddy, Jr., Columbia, MD (US)

(72) Inventors: Boris N. Feigelson, Springfield, VA (US); Jennifer K. Hite, Arlington, VA (US); Francis J. Kub, Arnold, MD (US); Charles R. Eddy, Jr., Columbia, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 192 days.

This patent is subject to a terminal disclaimer.

(21) Appl. No.: 13/794,877

(22) Filed: Mar. 12, 2013

(65) Prior Publication Data

US 2013/0186326 A1 Jul. 25, 2013

Related U.S. Application Data

(62) Division of application No. 12/952,225, filed on Nov. 23, 2010, now Pat. No. 8,679,248.

(60) Provisional application No. 61/263,420, filed on Nov. 23, 2009.

(51) Int. Cl.
*C30B 19/02* (2006.01)
*C30B 9/00* (2006.01)
(Continued)

(52) U.S. Cl.
CPC ... *C30B 9/00* (2013.01); *C30B 9/10* (2013.01); *C30B 29/406* (2013.01); *C30B 29/62* (2013.01); *C30B 19/02* (2013.01); *C30B 19/00* (2013.01); *C30B 19/04* (2013.01); *C30B 19/10* (2013.01)

(58) Field of Classification Search
CPC ........ C30B 19/00; C30B 19/02; C30B 19/04; C30B 19/08
USPC ............. 117/11, 71, 73–75, 77–79, 921, 937, 117/952; 252/518.1, 521.6, 584; 257/615, 257/E33.025, E33.028, E33.03, E33.033
See application file for complete search history.

(56) References Cited

U.S. PATENT DOCUMENTS 3,630,691 A 12/1971 Burnett et al.
3,829,556 A * 8/1974 Logan et al. .................. 423/409
(Continued)

OTHER PUBLICATIONS

Elwell et al. "Crystal growth of GaN by the reaction between gallium and ammonia," Journal of Crystal Growth, vol. 66, Iss. 1. pp. 45-54 (1984).
(Continued)

*Primary Examiner* — Kenneth A Bratland, Jr.
(74) *Attorney, Agent, or Firm* — US Naval Research Laboratory; Joslyn Barritt

(57) ABSTRACT

Millimeter-scale GaN single crystals in filamentary form, also known as GaN whiskers, grown from solution and a process for preparing the same at moderate temperatures and near atmospheric pressures are provided. GaN whiskers can be grown from a GaN source in a reaction vessel subjected to a temperature gradient at nitrogen pressure. The GaN source can be formed in situ as part of an exchange reaction or can be preexisting GaN material. The GaN source is dissolved in a solvent and precipitates out of the solution as millimeter-scale single crystal filaments as a result of the applied temperature gradient.

9 Claims, 5 Drawing Sheets

(51) Int. Cl.
*C30B 9/10* (2006.01)
*C30B 29/40* (2006.01)
*C30B 29/62* (2006.01)
*C30B 19/00* (2006.01)
*C30B 19/04* (2006.01)
*C30B 19/10* (2006.01)

(56) References Cited

U.S. PATENT DOCUMENTS

| | | | |
|---|---|---|---|
| 8,679,248 B2 * | 3/2014 | Feigelson et al. | 117/11 |
| 2006/0048699 A1 * | 3/2006 | D'Evelyn et al. | 117/68 |
| 2007/0095276 A1 | 5/2007 | Sunkara et al. | |
| 2007/0248526 A1 * | 10/2007 | Spencer et al. | 423/412 |
| 2009/0223440 A1 * | 9/2009 | Feigelson et al. | 117/56 |
| 2009/0253250 A1 | 10/2009 | Samuelson et al. | |

OTHER PUBLICATIONS

Madar et al. "High pressure solution growth of GaN," Journal of Crystal Growth, vol. 31, pp. 197-203 (1975).

Search report and written opinion dated 14.01.11 in related PCT Application No. PCT/US2010/057698.

* cited by examiner

METHOD OF GROWING GAN WHISKERS FROM A GALLIUM-CONTAINING SOLVENT AT LOW PRESSURE AND LOW TEMPERATURE

CROSS-REFERENCE

This application is a Continuation of and claims the benefit of priority based on U.S. patent application Ser. No. 12/952,225 filed on Nov. 23, 2010, now U.S. Pat. No. 8,679,248, which in turn is a nonprovisional of and claims the benefit of priority based on U.S. Provisional Patent Application No. 61/623,420 filed on Nov. 23, 2009, both of which are hereby incorporated by reference into the present application in their entirety.

TECHNICAL FIELD

The present invention relates to millimeter-scale single crystal gallium nitride (GaN) filaments, also known as GaN whiskers, and methods of growing such whiskers from solution.

BACKGROUND

Nitrides of indium (In), gallium (Ga), and aluminum (Al) and compounds thereof have many applications, including high-power and light-emitting devices. By moving to one dimensional, i.e. nanoscale, materials, a host of new applications become available.

Current nanoscale GaN technology is based on nanowires grown either by metal organic chemical vapor deposition (MOCVD) or molecular beam epitaxy (MBE). These nanoscale materials are defined by having very large surface to volume ratios. When reducing the material to this scale, surface effects can begin to dominate the material properties and degrade performance. For example, in optical applications, the large surface area can cause photon scattering, while the small size also restricts the charge carrying capacity of the material.

One method for solving these problems involves using GaN material on a macro-scale, in the form of millimeter-scale filaments, also known as whiskers. Such whiskers may bridge the gap between bulk and nanoscale GaN. In this case, the material is more representative of the bulk, can carry larger charges, and should show less phonon scattering. In addition, due to their larger size, the whiskers are easier to manipulate. Growing the whiskers from solution also avoids the residual metal catalysis beads found at the tip of nanowires and allows for crystalline perfection.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides millimeter-scale GaN single crystals in filamentary form, also known as GaN whiskers, grown from solution.

The present invention also provides a process that can be used to grow such GaN whiskers at moderate temperatures and near atmospheric pressures.

In accordance with the present invention, GaN whiskers can be grown, either with or without a seed, from a solution in a reaction vessel subjected to a temperature gradient at nitrogen pressure.

In a first exemplary embodiment of the present invention, a GaN feedstock can be created in an initial reaction step which also creates a solvent for the GaN. The reaction vessel containing the formed GaN feedstock and the formed solvent is subjected to a temperature gradient at constant pressure, wherein the GaN feedstock is dissolved in the solvent in a region of the reaction vessel at or near the high end of the temperature gradient and precipitates, either self-seeded or on a seed, as GaN whiskers in a region of the reaction vessel at or near the low end of the temperature gradient.

In a second exemplary embodiment of the present invention, the initial reaction step can be omitted, and a preexisting solid GaN sample can be placed in a preexisting solvent in the reaction vessel. The reaction vessel can then be subjected to a temperature gradient at constant pressure, wherein the GaN feedstock is dissolved in the solvent in a region of the reaction vessel at or near the high end of the temperature gradient and precipitates, either self-seeded or on a seed, as GaN whiskers in a region of the reaction vessel at or near the low end of the temperature gradient.

BRIEF DESCRIPTION OF THE DRAWINGS

FIG. 1A illustrates an exemplary initial configuration of the reactor before an exchange reaction which forms a GaN feedstock in accordance with a first embodiment of the present invention. FIG. 1B illustrates the reactor containing a GaN feedstock dissolved in a solvent, where the GaN feedstock is either one formed during the exchange reaction in accordance with a first embodiment or a preexisting GaN feedstock in accordance with a second embodiment of the present invention.

FIG. 2A illustrates an exemplary initial configuration of the reactor before an exchange reaction which forms a GaN feedstock. FIG. 2B illustrates the reactor containing a GaN feedstock dissolved in a solvent, where the GaN feedstock is either one formed during the exchange reaction in accordance with a first embodiment or a preexisting GaN feedstock in accordance with a second embodiment of the present invention.

FIG. 3A depicts an array of GaN whiskers grown on a seed surface in accordance with the present invention. FIG. 3B depicts a single exemplary 2 mm long GaN whisker in accordance with the present invention and illustrates its length and growth direction.

DETAILED DESCRIPTION

Figure 1A:
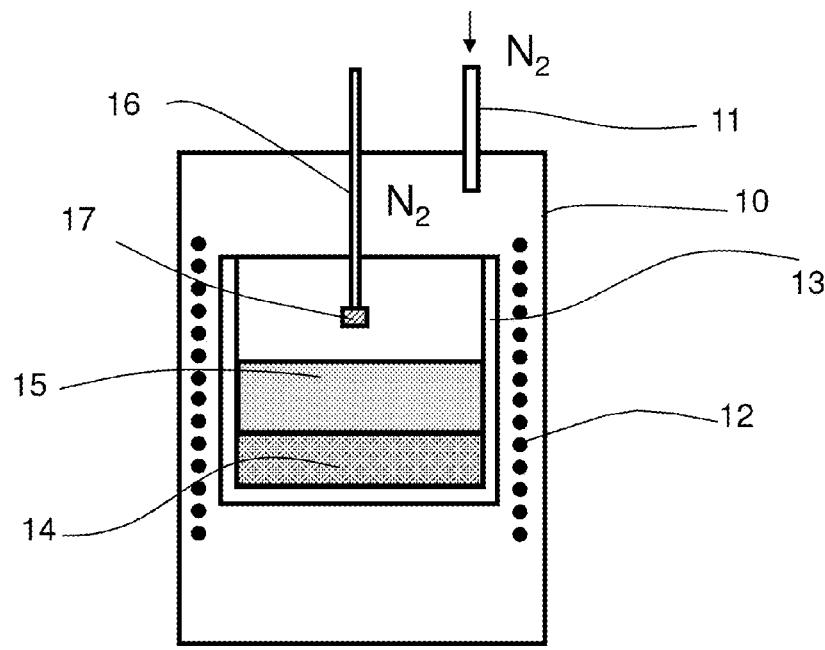
FIGS. 1A and 1B are schematic cross-sectional views showing an exemplary GaN growth reactor in accordance with the present invention.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides millimeter-scale gallium nitride (GaN) single crystals in filamentary form, also known as GaN whiskers, grown from solution.

The present invention also provides a method that can be used to grow GaN whiskers at moderate temperatures and near atmospheric pressures.

One essential part of the invention is the formation of the gallium nitride feedstock during the first stage of the growth run (self-developing process). The gallium nitride feedstock is formed by the exchange reaction of Group IA or/and Group IIA element (alkali metal or/and alkaline earth metal) nitride with gallium.

Another essential part of the invention is a solvent formation during the exchange reaction between Group IA or/and Group IIA element nitride and gallium (self-developing process). As a result of this reaction Group IA or/and Group IIA element is released and creates a compound with an initial composition. The new composition serves as a solvent for the GaN source.

More specifically, the process for growing single crystal gallium nitride includes the following steps. Group IA or/and Group IIA element nitride is placed in a region of the reaction vessel, which under operating conditions will have a temperature at or near the high end of the temperature gradient, and a layer of material comprised of gallium or gallium with alkali metal or/and alkaline earth metal composition interposed between the Group IA or/and Group IIA nitride and the deposition site (a region of the reaction vessel, which under operating conditions will have a temperature at or near the low end of the aforementioned temperature gradient), and also may include at least one seed crystal located within the deposition site. The reaction vessel with the charge is placed in the reactor filled with nitrogen, simultaneously subjecting the reaction vessel and the charge therein both to pressure and temperature in the gallium nitride-stable region of the phase diagram of gallium nitride. Pressure of nitrogen during the growth run is maintained in the range from 0.1 MPa to 20 MPa, but not limited to within this range. The charge is heated under nitrogen atmosphere to the temperature when the reaction between Group IA or/and Group IIA element nitride and gallium occurs. As a result of this exchange reaction part of the gallium replaces Group I and/or Group II element in the nitride and gallium nitride feedstock is created. Released from the nitride Group IA or/and Group IIA element is mixed with residual gallium or its said composition and forms a compound which serves as a solvent for gallium nitride source. The next step of the process is to maintain the growth temperature and pressure with a temperature gradient between the formed GaN feedstock and the nucleation site. The formed gallium nitride feedstock is dissolved by the solvent in a region of the reaction vessel, which under operating conditions has a temperature at or near the high end of the temperature gradient and said dissolved gallium nitride precipitates as a single gallium nitride crystal within the deposition site, which under operating conditions has a temperature at or near the low end of the aforementioned temperature gradient. The deposition site may have at least one GaN seed or the gallium nitride crystal can start to grow by spontaneous nucleation. The heat is kept for the time required to grow the desired gallium nitride crystal and then the heating step is discontinued.

In accordance with the present invention, a GaN feedstock or other source of GaN is dissolved in a reaction chamber at nitrogen pressure. A temperature gradient is then applied to the reaction chamber. The temperature gradient and applied pressure control the dissolution of GaN in the solvent and cause GaN whiskers to precipitate from the solution.

In some embodiments, a seed crystal may be present in the reaction chamber. In such embodiments, the seed crystal is typically the coldest spot in the reaction vessel within the reactor when precipitation of GaN whiskers takes place. Due to the driving force imparted to the GaN dissolved in the solvent, GaN leaves the solvent when the solvent becomes supersaturated with GaN and precipitates on the seed crystal as whiskers and, if supersaturation is high enough, whiskers also nucleate and grow around the seed. In other embodiments, the process is carried out without the seed crystal, and in such cases nucleation and growth of GaN whiskers take place within the colder parts of the reaction vessel containing the solvent.

A first exemplary embodiment of the invention includes the formation of a GaN feedstock and a solvent for the GaN during a first stage of the growth run in a self-developing process. Thus, in this embodiment, in a first stage of a GaN whisker growth run, a GaN feedstock is formed by an exchange reaction of a Group IA and/or Group IIA element (i.e., alkali metal and/or alkaline earth metal) nitride with gallium in one part of the reaction chamber, while a solvent for the GaN simultaneously is formed in another part of the vessel. A detailed description of this aspect of a process for growing millimeter-scale GaN whiskers in accordance with the present invention is given in United States Patent Application Publication No. 2009/0223440, which shares an inventor in common with the present application and is hereby incorporated by reference into the present disclosure in its entirety.

Figure 1B:
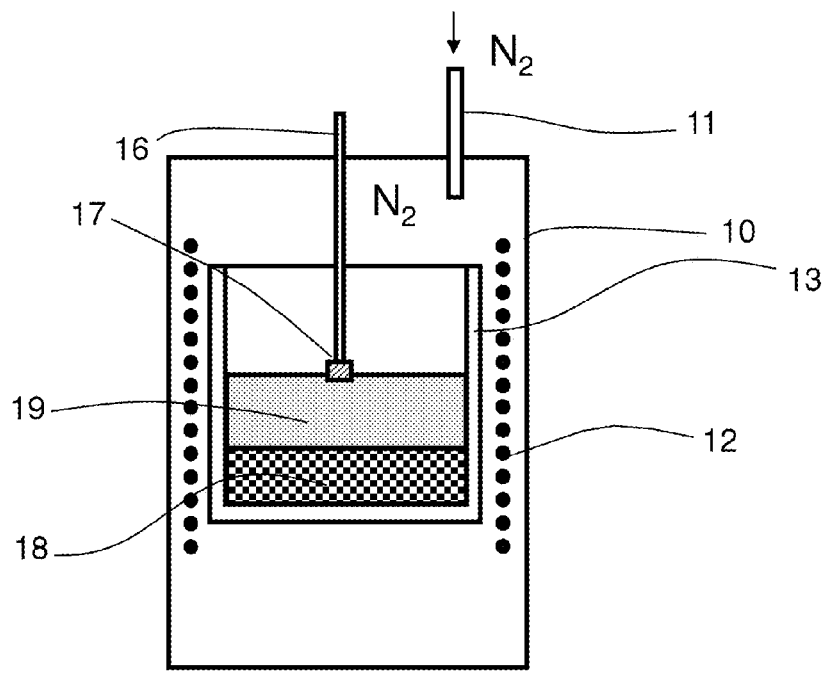

This first exemplary embodiment of a process for growing single crystal GaN in accordance with the present invention is now described with respect to the reaction apparatus shown in FIGS. 1A and 1B. FIG. 1A illustrates an exemplary initial configuration of the growth reactor in a first embodiment of the present invention. As illustrated in FIG. 1A, a nitride layer 14 comprising a layer of a Group IA or/and Group IIA element nitride is placed at the bottom of a reaction vessel 13 and a metallic layer 15 comprising a mixture of gallium with bismuth (Bi) or/and antimony (Sb) is disposed over the nitride layer 14. An alkali metal, an alkaline earth metal, or any combination thereof may be added to the metallic layer 15. Of the alkali metal nitrides, lithium nitride is preferred, though other alkali metal nitrides and alkaline earth metal nitrides may also be used, and all such embodiments are within the scope of the present disclosure.

The reaction vessel 13 with the thus-assembled charge is placed in a nitrogen-filled reactor 10 which also contains a furnace 12 and has a nitrogen inlet 11 at the top thereof. In a first step of a method for preparing GaN whiskers in accordance with the present invention, the reaction vessel 13 and the charge therein are simultaneously subjected to temperature and nitrogen pressure, both of which are in the GaN-stable region of the phase diagram of GaN. The nitrogen pressure is supplied via nitrogen introduced into the reaction vessel from inlet 11. During the growth run the pressure is maintained, for example, in a range of from about 0.1 MPa to about 20 MPa, though pressures outside this range may be appropriate as conditions warrant.

The reaction vessel 13 and charge are heated by means of furnace 12 to a temperature at which the Group IA/IIA element nitride in nitride layer 14 reacts with the gallium in metallic layer 15. As a result of this reaction, part of the Group IA and/or Group IIA element is released from charge 14 and the released Group IA/IIA element is replaced by part of the gallium from metallic layer 15, with the result being the formation of GaN feedstock 18 shown in FIG. 1B. Simultaneously, the Group IA and/or Group IIA element released from charge 14 mixes with the residual gallium and other components in metallic layer 15 to form a molten solvent 19 for the GaN. Thus, as a result of this first step in accordance with this embodiment of the present invention, as illustrated in FIG. 1B, the reaction vessel 13 now contains a GaN feedstock 18 which is covered by a layer of molten solvent 19.

In a second step of a method for preparing GaN whiskers in accordance with this embodiment of the present invention, the reaction vessel 13 is heated by furnace 12 to a growth temperature which is higher than temperature of the exchange reaction in the first step so that the solvent remains in a molten state, but which is lower than the temperature of GaN decomposition at the applied nitrogen pressure.

In addition, in accordance with the present invention, a temperature gradient is maintained between the GaN feedstock 18 and the GaN deposition site, whereby the temperature of solvent 19 which is near the GaN feedstock 18 is higher than the temperature of the solvent 19 which is near the deposition site for the growth of the GaN whiskers. As a result, the GaN feedstock 18 is dissolved in the relatively hotter part of solvent 19, creating a supersaturated solution of GaN in the relatively cooler part. The dissolved GaN then precipitates from this supersaturated solution in the part of reaction vessel 14, which is at the low end of the temperature gradient. In accordance with the present invention, the precipitated GaN is in the form of micro-scale single GaN crystals in filamentary form, i.e., GaN whiskers.

In some embodiments, one or more GaN seed crystals 17, each held in a corresponding seed holder 16, may be immersed in or in contact with the solvent 19, and in such cases the precipitated GaN can grow on the seed, while in other embodiments where such a seed crystal is not present, the GaN whiskers can grow after spontaneous nucleation inside the solution 19. In either case, the GaN whiskers in accordance with the process described above are micro-scale, growing up to several millimeters in length.

A second exemplary embodiment of the process for producing GaN whiskers in accordance with the present invention can also be described with respect to the illustrative reaction configuration shown in FIG. 1B.

This second exemplary embodiment of a process for growing GaN whiskers in accordance with the present invention uses a preexisting solid GaN source prepared by HVPE GaN growth or any other suitable process as a GaN feedstock instead of the GaN feedstock formed from the Group IA/IIA nitride reacted with gallium as described above with respect to the first embodiment. As described in more detail below, when heated, the solid GaN feedstock dissolves in a solvent comprising gallium with a Group IA metal, a Group IIA metal, Bi, Sb, or any combination thereof, with lithium being a preferred Group IA/IIA metal, and the dissolved GaN is precipitated into single crystal whiskers.

Thus, in accordance with this embodiment of the present invention, a charge comprising a preexisting GaN feedstock 18 and a layer 19 of solvent is placed in reaction vessel 13 and the thus-filled reaction vessel 13 is placed into reactor 10 and heated under pressure as described above with respect to the first exemplary embodiment. As in the first embodiment, the reaction vessel 13 and charge are simultaneously subjected to both temperature and pressure in the GaN-stable region of the phase diagram of GaN, where the vessel is heated to a liquefaction temperature of the solvent. A temperature gradient is then provided by furnace 12, wherein one part of the reaction vessel is maintained at a higher temperature than another part, and in accordance with the present invention, the GaN feedstock 18 dissolves in solvent 19 within the part of reaction vessel 13 at the high end of the temperature gradient and precipitates out of the solution as GaN whiskers in the part of reaction vessel 14 which is at the low end of the temperature gradient. As in the first embodiment described above, the whiskers can be self-seeded, growing inside solution 19, or can be grown on a seed 17 if one or more is present within the cooler part of the reaction vessel, and in either case, can be up to several millimeters in length.

In some embodiments a GaN seed can be placed at the bottom of the reaction vessel. These embodiments are illustrated in FIGS. 2A and 2B, where the numbered elements correspond to the numbered elements shown in FIGS. 1A and 1B with the substitution of the numeral "2" for the numeral "1", e.g., reaction vessel 13 shown in FIG. 1A becomes reaction vessel 23 shown in FIG. 2A.

Figure 2A:
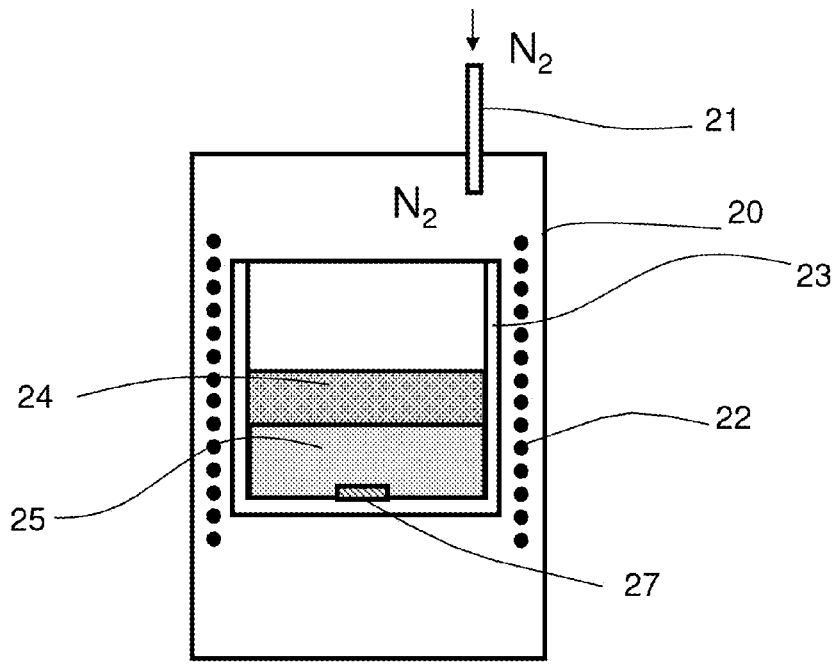
FIGS. 2A and 2B are schematic cross-sectional views showing an exemplary GaN growth reactor which contains a GaN seed in accordance with further embodiments of the present invention.
Figure 2B:
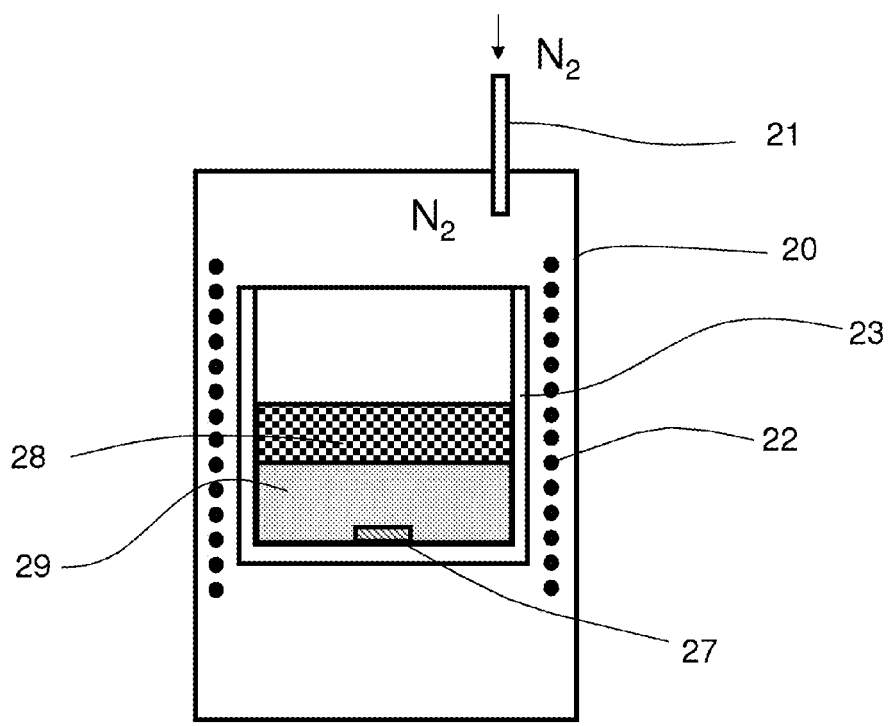

Thus, as shown in FIG. 2A, in an additional embodiment of the invention, a GaN seed 27 can be placed at the bottom of the reaction vessel 23. The GaN seed 27 can then be covered with a metallic layer 25 comprising a mixture of gallium with Bi, Sb, a Group IA element, a Group IIA element, or any combination thereof, with a nitride layer 24 comprising a solid Group IA and/or Group IIA element nitride disposed on top of metallic layer 25. In other words, the layer order in this embodiment is reversed from the order described above with respect to FIG. 1A.

The reaction vessel 23 containing the thus-assembled charge can then be placed in reactor 20 with nitrogen source 21 and furnace 22, be heated under nitrogen pressure to induce an exchange reaction to form a GaN source and a solvent as described with respect to the first embodiment above, and subsequently be subjected to a temperature gradient that causes the dissolved GaN to precipitate as GaN whiskers in the cooler part of the solvent. However, in this embodiment, rather than forming below the solvent as in the first embodiment, as shown in FIG. 2B, the GaN source 28 is formed at the top of the charge located within the reaction vessel, with the solvent 29 being formed under the source. In addition, in this embodiment, the temperature gradient applied by furnace 22 is in the opposite direction from that applied in the first embodiment described above, so that the GaN whiskers are formed on seed 27 at the bottom of the reaction chamber 23.

In another embodiment, corresponding to the second exemplary embodiment described above and also illustrated in FIG. 2B, seed 27 can be placed at the bottom of reaction vessel 23 and be covered with a solvent layer 29 comprising gallium with Bi, Sb, a Group IA element, a Group IIA element, or any combination thereof, which in turn is covered by a solid GaN source 28. Again, it should be noted that the layer structure in this embodiment and as shown in FIG. 2B is the opposite of the layer structure described above with respect to FIG. 1B.

As with the second embodiment described above, the reaction vessel 23 and charge are simultaneously subjected to both temperature and pressure in the GaN-stable region of the phase diagram of GaN whereby solvent 29 becomes a molten solvent which dissolves the solid GaN 26 therein, with the thus-dissolved GaN precipitating as single-crystal GaN whiskers upon the application of a temperature gradient. In this case, however, the applied temperature gradient is in the opposite direction from that applied in the second embodiment, and thus in this embodiment the GaN whiskers precipitate onto seed 27 at the bottom of the reaction vessel.

In all of these cases, during the process of GaN growth, the pressures and temperatures used can be in a moderate range and thus can be readily accomplished using easily available equipment. For example, the solvent reaches a molten state when the reaction vessel is heated to a temperature in the range of 700-900° C., more typically 750-850° C., and the nitrogen pressure in the growth reactor is typically above atmospheric, more typically 0.1-2.0 MPa. The temperature gradient, i.e., the temperature difference inside the solvent between the GaN source and the growing crystal, is typically 1-100° C. across the thickness of the solvent, and more typically 5-50° C.

Having described various exemplary embodiments of the invention, the following examples are given as further particular embodiments thereof and to demonstrate the practice and advantages thereof. It is understood that the examples are given only by way of illustration and are not intended to limit the scope of the claims in any manner.

Example 1

This example demonstrates preparation of GaN whiskers at moderate temperature and moderate pressure in accordance with the present invention using a charge comprising lithium nitride, gallium and bismuth. All material preparations of the charge were carried out inside a glove box under a nitrogen atmosphere with moisture and oxygen content below 1 ppm.

In this example, a layer of commercially available lithium nitride which had been previously compacted into a pill of approximately 1.2 g was placed at the bottom of the reaction vessel. A mixture of 15.0 g of gallium and 0.5 g of bismuth was then placed in a layer on top of the lithium nitride pill.

After the reaction vessel was filled with the charge, it was placed into the reactor. The reactor was evacuated to a vacuum level of $10^{-3}$ Torr, filled with nitrogen of 99.999% purity to a pressure of 0.1 MPa and then evacuated to a vacuum level of $10^{-3}$ Torr once more. After the evacuation, the furnace was filled with nitrogen of 99.999% purity to a pressure of 0.24 MPa.

The reaction vessel was then heated by a furnace. During heating, part of the gallium reacted with the lithium nitride in an exchange reaction to form a gallium nitride source at the bottom of the crucible. At the same time, the lithium released during the exchange reaction mixed with residual liquid gallium and formed a solvent for gallium nitride on top of the gallium nitride source.

After the completion of the exchange reaction, the reaction vessel was further heated so that the temperature at the lower end of the reaction vessel, where the gallium nitride source was located, was maintained at 800° C., while the temperature at the higher end, where the solvent was located, was maintained at 790° C., resulting in a temperature difference of 10° C. from the bottom of the solvent layer to its top in the reaction vessel. Gallium nitride source started to dissolve in the created solvent, saturating the solution. A piece of polycrystalline gallium nitride seed was immersed from the top into the solution when the temperature at the bottom reached 800° C. The growth conditions of the process were maintained for 54 hours, following which the polycrystalline seed was pulled out, the reactor was cooled to room temperature, and the nitrogen pressure was allowed to be reduced to atmospheric.

Figure 3A:
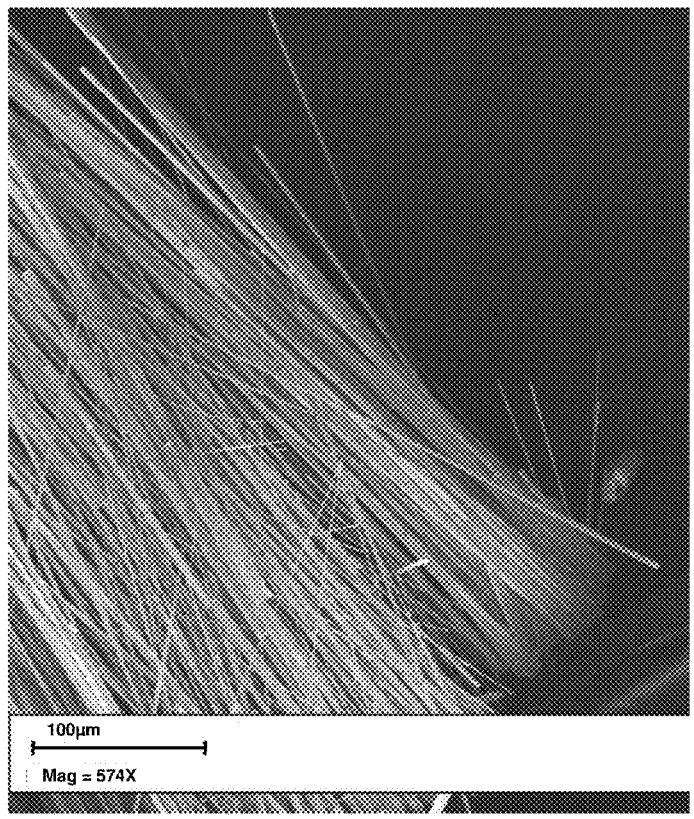
FIGS. 3A and 3B are optical images of exemplary GaN whiskers in accordance with the present invention.
Figure 3B:
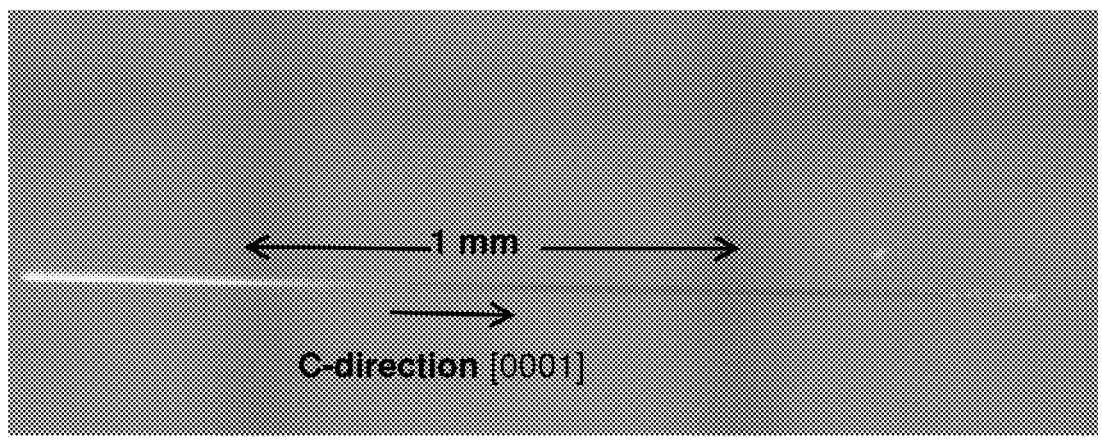
Figure 4:
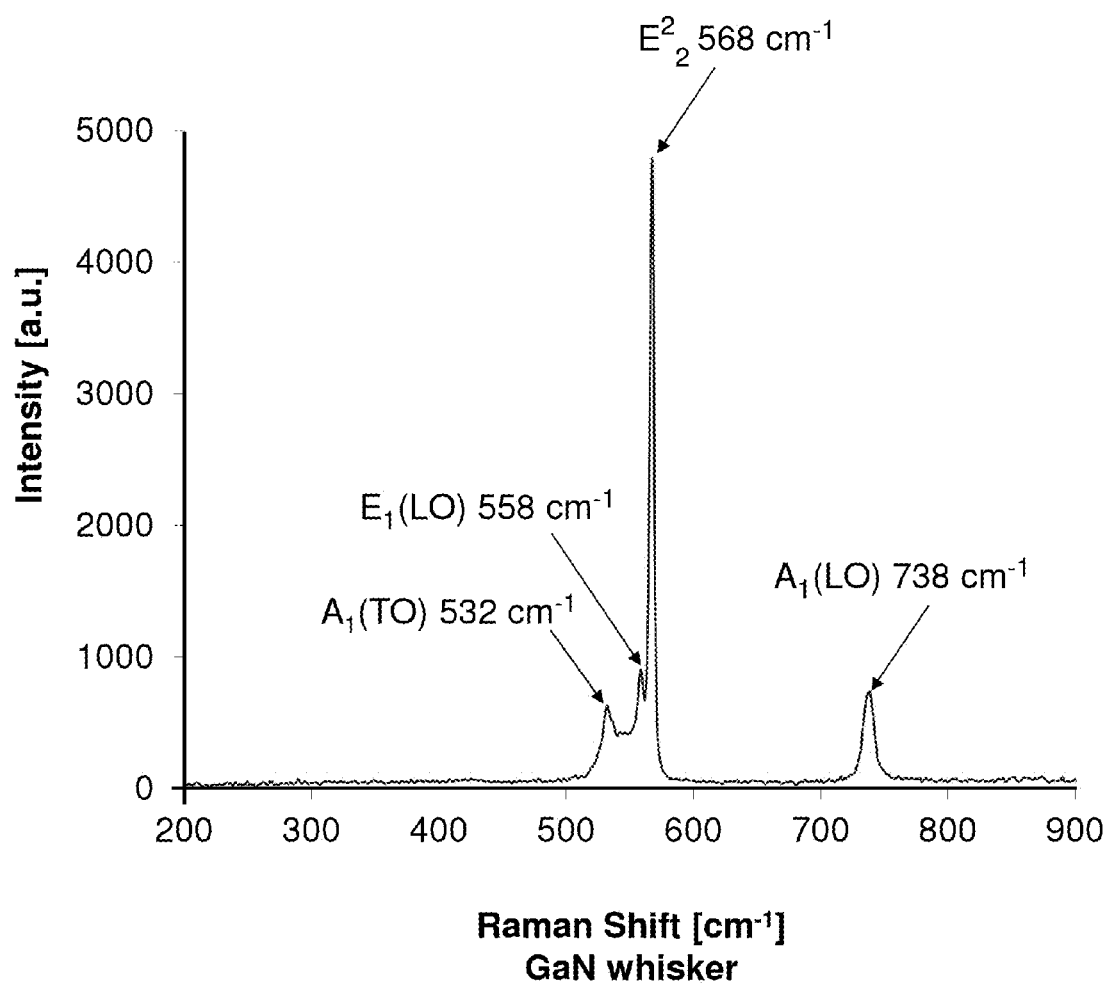
FIG. 4 is a room temperature micro-Raman spectrum of an exemplary GaN whisker in accordance with the present invention.

After cleaning the remaining solution from the seed, the grown GaN whiskers shown in FIG. 3A were found on the immersed portion of the seed and also inside the top layer of the solution around the seed. As illustrated in FIG. 3B, the whiskers grew in the c-direction, with some of the whiskers being up to 2 mm long. Micro-Raman measurements illustrated in FIG. 4 confirmed that the whiskers were single crystal GaN with structural quality and low impurity concentration.

Figure 5A:
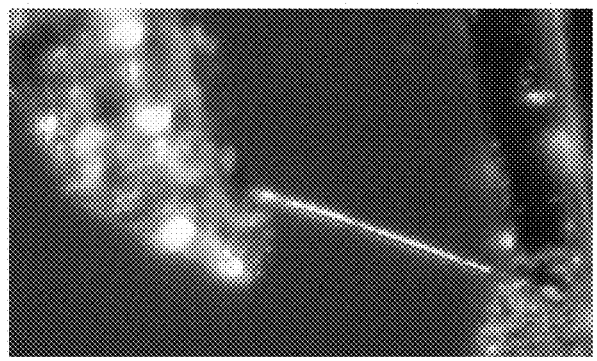
FIGS. 5A-5C are optical images illustrating the flexibility and elasticity of an exemplary GaN whisker in accordance with the present invention.
Figure 5B:
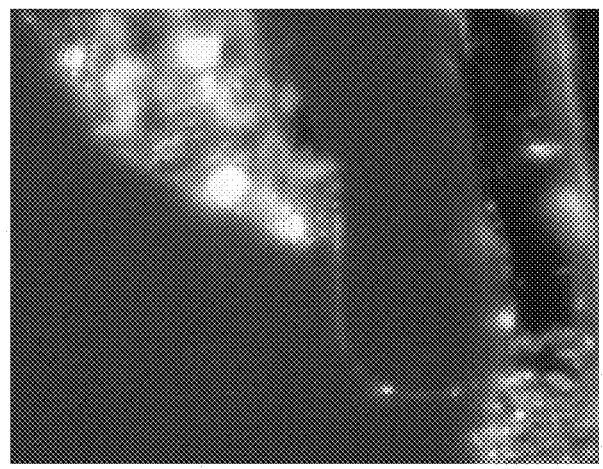
Figure 5C:
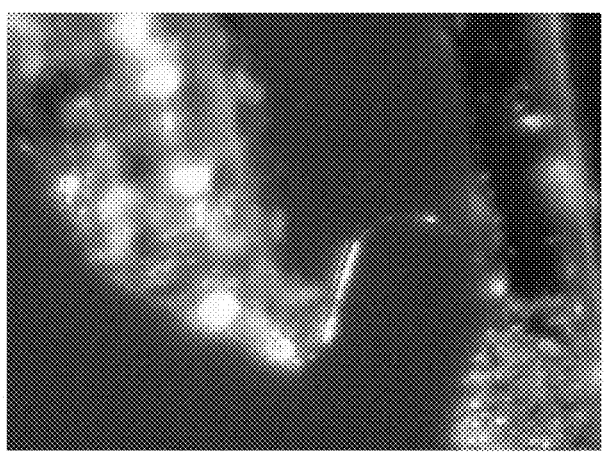

In addition, the grown single crystal GaN whiskers exhibited exceptional mechanical properties. As illustrated in FIGS. 5A, 5B, and 5C, they could be bent without breaking and elastically returned to their initial straight shape.

Example 2

This example demonstrates preparation of GaN whiskers at moderate temperature and moderate pressure in accordance with the present invention, using a charge comprising a preexisting GaN source and a mixture of gallium, antimony, and bismuth.

A piece of commercially available polycrystalline GaN of approximately 0.8 g was placed at the bottom of the reaction vessel (crucible). A mixture of a mixture of 8.0 g of gallium, 0.1 g of Sb and 0.150 g of Bi was placed on top of the GaN source to complete the charge.

After the reaction vessel was filled with the charge, it was placed into the reactor. The reactor was evacuated to a vacuum level of $10^{-3}$ Torr, filled with nitrogen of 99.999% purity to a pressure of 0.1 MPa and then evacuated to a vacuum level of $10^{-3}$ Torr once more. After the evacuation, the furnace was filled with nitrogen of 99.999% purity to a pressure of 0.25 MPa.

The reaction vessel was then heated by the furnace such that the temperature of the lower end of the reaction vessel was maintained at 800° C. and the temperature at the higher end of the solvent was maintained at 790° C., thereby resulting in a temperature difference of 10° C. inside the solvent in the reaction vessel. Gallium nitride source started to dissolve in the created solvent, saturating the solution. A seed of polycrystalline HVPE gallium nitride was partly immersed from the top into the solution when the temperature at the bottom reached 800° C. The growth conditions of the process were maintained for 62 hours. At the end of that time period, the seed was pulled out, the system was cooled to room temperature, and the nitrogen pressure was allowed to be reduced to atmospheric. After cleaning the remaining solution from the seed, grown GaN whiskers were found on the immersed portion of the seed and also inside the top layer of the solution around the seed. These whiskers exhibited similar characteristics as those described above with respect to the whiskers grown in Example 1.

Thus, as described herein, in accordance with the present invention, micro-scale GaN whiskers readily can be grown from solution at moderate temperatures and pressures, using easily available equipment.

Although particular embodiments, aspects, and features have been described and illustrated, it should be noted that the invention described herein is not limited to only those embodiments, aspects, and features, and it should be readily appreciated that modifications may be made by persons skilled in the art. The present application contemplates any and all modifications within the spirit and scope of the underlying invention described and claimed herein, and all such embodiments are also contemplated to be within the scope and spirit of the present disclosure.

What is claimed is:

1. A low pressure and low temperature process for growing gallium nitride whiskers from solution, comprising:
   (a) charging a reaction vessel with a gallium composition comprising gallium mixed with at least one of bismuth and antimony, a Group IA element material, and gallium nitride;
   (b) placing the charged reaction and vessel into a chamber;
   (c) applying a nitrogen gas pressure of 0.1 to 20 MPa to the reaction vessel;
   (d) applying a temperature of between 700 to 900° C. to the reaction vessel (i) to cause the gallium nitride from the gallium nitride and/or nitrogen to dissolve in the solvent comprising gallium, at least one of bismuth and antimony, and the Group IA element; (ii) to form a solution; and (iii) to precipitate gallium nitride out of the solution exclusively in the form of gallium nitride whiskers.

2. The process of claim 1, wherein the second temperature is a liquefaction temperature of the solution.

3. The process of claim 1, further comprising providing a temperature difference of 1-100° C. across a depth of the solution.

4. The process of claim 1, wherein the nitrogen gas pressure is 0.2 MPa.

5. The process of claim 1, wherein the temperature is 750-850° C.

6. The process of claim 1, wherein the Group IA element material is lithium.

7. The process of claim 1, further comprising exposing a gallium nitride seed to the solvent, wherein the gallium nitride precipitates out of the solution as gallium nitride whiskers precipitates on the seed.

8. The process of claim 7, wherein the gallium nitride seed is one selected from the group consisting of a single crystal gallium nitride, a polycrystalline gallium nitride, and a wafer of gallium nitride.

9. The process according to claim 1, wherein the fraction of the at least one of bismuth and antimony in the gallium is less than 10 mol %.

* * * * *